(12) United States Patent
Tang

(10) Patent No.: US 12,341,073 B2
(45) Date of Patent: Jun. 24, 2025

(54) FORMING METHOD OF SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Huiwen Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 457 days.

(21) Appl. No.: 17/808,352

(22) Filed: Jun. 23, 2022

(65) Prior Publication Data

US 2023/0282537 A1  Sep. 7, 2023

Related U.S. Application Data

(63) Continuation of application No. PCT/CN2022/091114, filed on May 6, 2022.

(30) Foreign Application Priority Data

Mar. 3, 2022  (CN) .......................... 202210210156.7

(51) Int. Cl.
   *H01L 23/31* (2006.01)
   *H01L 21/02* (2006.01)
(52) U.S. Cl.
   CPC ........ *H01L 23/3192* (2013.01); *H01L 21/022* (2013.01); *H01L 21/02271* (2013.01); *H01L 23/3171* (2013.01)
(58) Field of Classification Search
   None
   See application file for complete search history.

(56) References Cited

U.S. PATENT DOCUMENTS

| | | | |
|---|---|---|---|
| 5,360,769 A | 11/1994 | Thakur et al. | |
| 5,470,611 A | 11/1995 | Yang et al. | |
| 5,885,870 A | 3/1999 | Maiti et al. | |
| 6,093,661 A | 7/2000 | Trivedi et al. | |
| 2003/0211692 A1* | 11/2003 | Lee | H10B 43/30 438/258 |
| 2004/0235281 A1 | 11/2004 | Downey et al. | |
| 2007/0072438 A1 | 3/2007 | Joe | |

FOREIGN PATENT DOCUMENTS

| | | |
|---|---|---|
| CN | 1998070 A | 7/2007 |
| CN | 105810613 A | 7/2016 |
| JP | H09139437 A | 5/1997 |

OTHER PUBLICATIONS

International Search Report cited in PCT/CN2022/091114 mailed Nov. 28, 2022, 8 pages.

\* cited by examiner

*Primary Examiner* — Asok K Sarkar
(74) *Attorney, Agent, or Firm* — Kilpatrick Townsend & Stockton LLP

(57) ABSTRACT

The present disclosure relates to the technical field of semiconductors, and provides a forming method of a semiconductor structure and a semiconductor structure. The forming method of a semiconductor structure includes: placing a target structure in a reaction chamber; forming a first oxide layer on the target structure, where the first oxide layer has a first thickness; and forming a second oxide layer under the first oxide layer, where the second oxide layer has a second thickness, and the first thickness is less than the second thickness.

18 Claims, 6 Drawing Sheets

FORMING METHOD OF SEMICONDUCTOR STRUCTURE AND SEMICONDUCTOR STRUCTURE

CROSS-REFERENCE TO RELATED APPLICATIONS

The present disclosure is a continuation application of International Patent Application No. PCT/CN2022/091114, filed on May 6, 2022, which claims the priority to Chinese Patent Application No. 202210210156.7, titled "FORMING METHOD OF SEMICONDUCTOR STRUCTURE AND SEMICONDUCTOR STRUCTURE" and filed on Mar. 3, 2022. The entire contents of International Patent Application No. PCT/CN2022/091114 and Chinese Patent Application No. 202210210156.7 are incorporated herein by reference in present disclosure.

TECHNICAL FIELD

The present disclosure relates to, but is not limited to, a forming method of a semiconductor structure and a semiconductor structure.

BACKGROUND

Semiconductor doping is a common process in semiconductor manufacturing, which is based on the principle of changing the electrical properties of a semiconductor material by implanting dopant ions into the semiconductor material. After dopant ions are implanted into the semiconductor material, the semiconductor material needs to be thermally annealed to activate the dopant ions, such that the dopant ions can provide carriers in the semiconductor material. However, when the semiconductor material is thermally annealed, some of the dopant ions escape from the semiconductor material due to heat, which affects the performance of the semiconductor material and pollutes the process environment.

SUMMARY

According to a first aspect, the present disclosure provides a forming method of a semiconductor structure. The forming method of a semiconductor structure includes:

placing a target structure in a reaction chamber; and forming a first oxide layer on the target structure, where the first oxide layer has a first thickness; and forming a second oxide layer under the first oxide layer, where the second oxide layer has a second thickness, and the first thickness is less than the second thickness.

A second aspect of the present disclosure provides a semiconductor structure, where the semiconductor structure includes:

a doped region, wherein the doped region includes dopant ions;

a first oxide layer, where the first oxide layer covers a surface of the semiconductor structure, and the first oxide layer has a first thickness; and a second oxide layer, where the second oxide layer is located under the first oxide layer, the second oxide layer has a second thickness, and the first thickness is less than the second thickness.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may derive other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Figure 1:
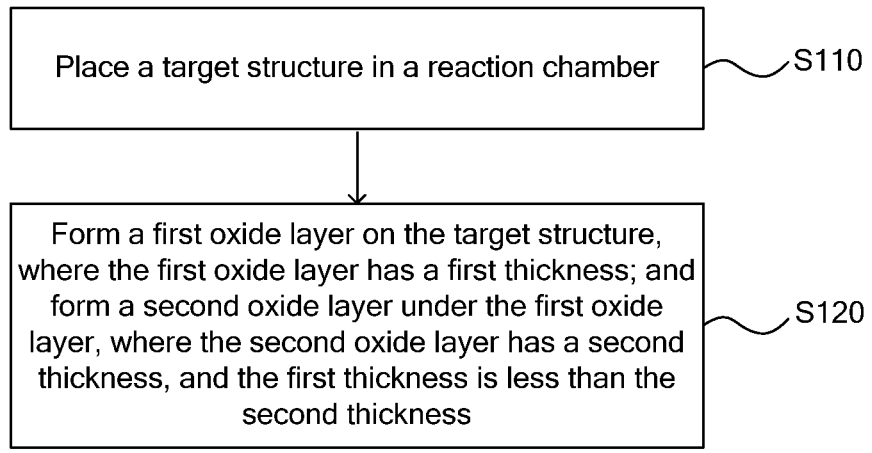
FIG. 1 is a flowchart of a forming method of a semiconductor structure according to an exemplary embodiment.

An exemplary embodiment of the present disclosure provides a forming method of a semiconductor structure. As shown in FIG. 1, FIG. 1 is a flowchart of a forming method of a semiconductor structure according to an exemplary embodiment of the present disclosure. The forming method of a semiconductor structure in this embodiment is described below with reference to FIG. 6 to FIG. 8.

As shown in FIG. 1, an exemplary embodiment of the present disclosure provides a forming method of a semiconductor structure. The forming method includes the following steps:

Step S110: Place a target structure in a reaction chamber.

In this embodiment, the target structure may be any structure for forming a semiconductor device.

Figure 6:
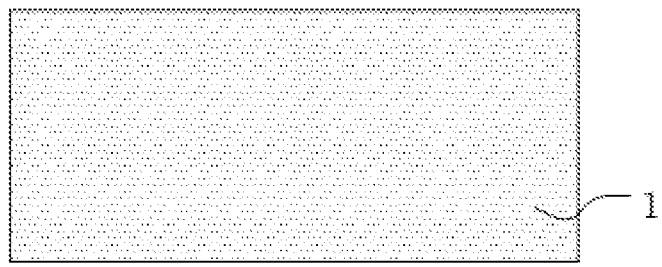
FIG. 6 is a schematic diagram of a target structure according to an exemplary embodiment.

Referring to FIG. 6, the target structure 1 may be a semiconductor substrate. A material of the semiconductor substrate may include one or more of silicon (Si), germanium (Ge), silicon-germanium (GeSi), or silicon carbide (SiC); or silicon on insulator (SOI) or germanium on insulator (GOI); or other materials such as gallium arsenide or other III-V compounds. The semiconductor substrate may be partially doped impurity ions as required, and the impurity ions may be n-type impurity ions or p-type impurity ions.

Step S120: Form a first oxide layer on the target structure, where the first oxide layer has a first thickness; and form a second oxide layer under the first oxide layer, where the second oxide layer has a second thickness, and the first thickness is less than the second thickness.

Figure 7:
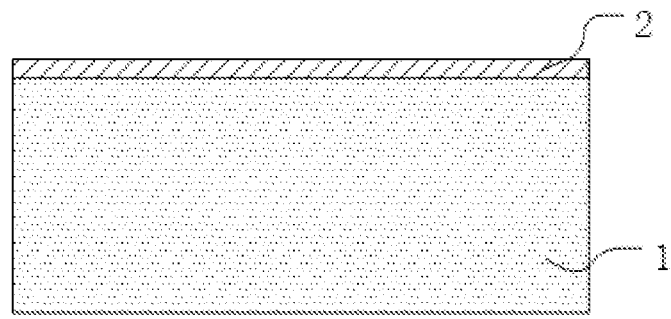
FIG. 7 is a schematic diagram of forming a first oxide layer on a surface of a target structure according to an exemplary embodiment.
Figure 8:
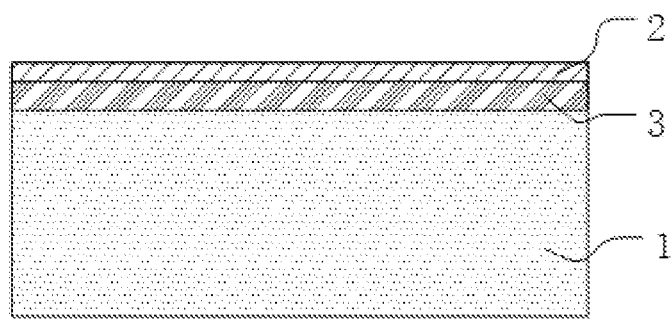
FIG. 8 is a schematic diagram of forming a second oxide layer under a first oxide layer according to an exemplary embodiment.

Referring to FIG. 7 and FIG. 8, the first oxide layer 2 is formed before the second oxide layer 3 is formed. Alternatively, the first oxide layer 2 is formed first, and after a predetermined period of time, the second oxide layer 3 is formed under the first oxide layer 2. Alternatively, the first oxide layer 2 and the second oxide layer 3 may be formed successively in a continuous period of time. The first oxide layer 2 and the second oxide layer 3 may have same or different properties. For example, the first oxide layer 2 and the second oxide layer 3 may have different components and densities. For another example, the first oxide layer 2 and the second oxide layer 3 may have the same components.

In the semiconductor structure formed in the method of this embodiment, the second oxide layer 3 is provided on a surface of the target structure. The first oxide layer 2 is provided at on side of the second oxide layer 3 that is away from the target structure. That is, when the target structure 1 is in a horizontal state, the first oxide layer 2 is located above second oxide layer 3. The second oxide layer 3 and the first oxide layer 2 provide a good shielding effect for the target structure 1, to ensure good electric performance of the semiconductor structure.

Figure 2:
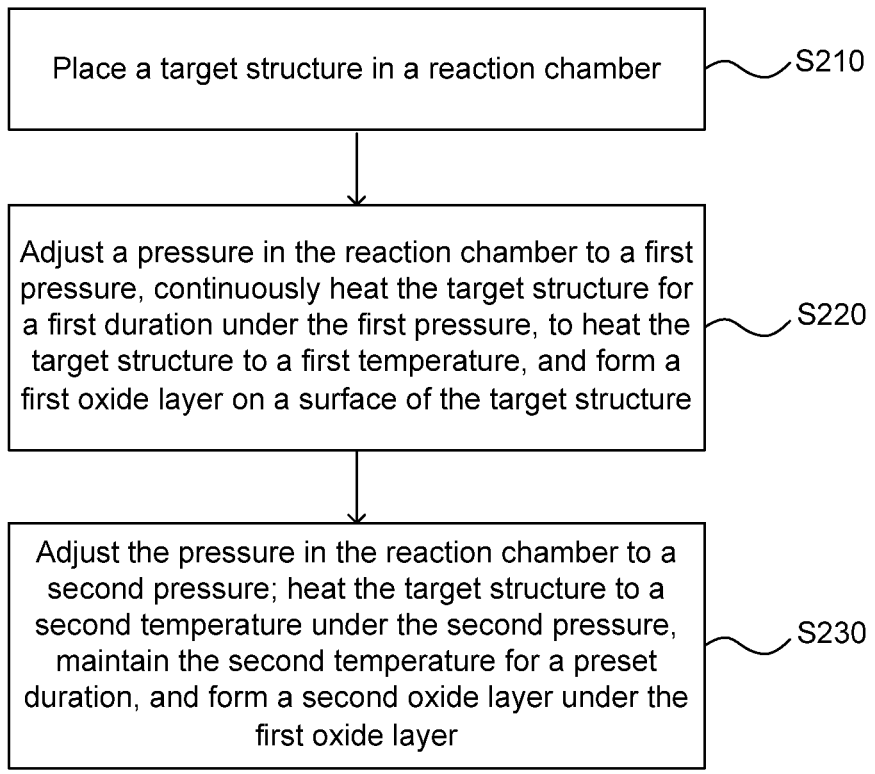
FIG. 2 is a flowchart of a forming method of a semiconductor structure according to an exemplary embodiment.

As shown in FIG. 2, an exemplary embodiment of the present disclosure provides a forming method of a semiconductor structure. The forming method of a semiconductor structure in this embodiment is described below with reference to FIG. 9 to FIG. 11.

As shown in FIG. 2, an exemplary embodiment of the present disclosure provides a forming method of a semiconductor structure. The forming method includes the following steps:

Step S210: Place a target structure in a reaction chamber.

Figure 9:
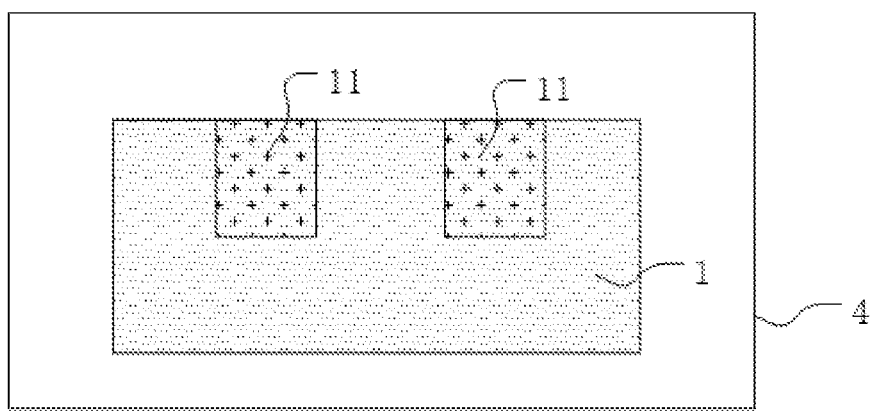
FIG. 9 is a schematic diagram of a target structure according to an exemplary embodiment.

As shown in FIG. 9, the target structure 1 includes one or more doped regions 11, and dopant ions are injected in the doped region 11, where the dopant ions may be p-type dopant ions or n-type dopant ions.

In this embodiment, a material of the target structure 1 includes a first material. The first material may be a semiconductor structure. The first material may include one of silicon, germanium, silicon germanide, or silicon carbide. The target structure 1 is doped with at least one type of dopant ions.

As shown in FIG. 9, the reaction chamber 4 may be a thermal annealing apparatus, for example, a vacuum annealing furnace, or a high-temperature furnace tube.

Step S220: Adjust a pressure in the reaction chamber to a first pressure, continuously heat the target structure for a first duration under the first pressure, to heat the target structure to a first temperature, and form a first oxide layer on a surface of the target structure 1.

An inert gas is injected into the reaction chamber 4 as a protective gas, and an oxygen-containing gas is injected into the reaction chamber 4 to form an oxygen-containing atmosphere in the reaction chamber 4. The oxygen-containing gas in this embodiment is an oxygen monomer gas with an oxidization property, for example, oxygen $O_2$ or ozone $O_3$; or, the oxygen-containing gas may be an oxygen compound gas, for example, water vapor $H_2O$. The pressure in the reaction chamber 4 is adjusted to the first pressure, and the target structure 1 is heated for the first duration at a predetermined heating rate, such that the target structure 1 is heated to the first temperature.

In the first pressure, an initial temperature of an oxide generated from the reaction between the first material and the oxygen-containing gas is equal to or lower than the first temperature. Partial first material in the target structure 1 reacts with the oxygen-containing gas in the reaction chamber 4, to generate an oxide of the first material. The oxide of the first material gradually grows downwards from the surface of the target structure 1, to form the first oxide layer 2. The first oxide layer 2 has a first thickness, where the first thickness is greater than 0.1 nm. Alternatively, when the target structure 1 is heated to the first temperature, as shown in FIG. 10, the first oxide layer 2 is formed on the surface of the target structure 1, and the first oxide layer 2 covers a part of the doped region 11 in the target structure 1.

Figure 10:
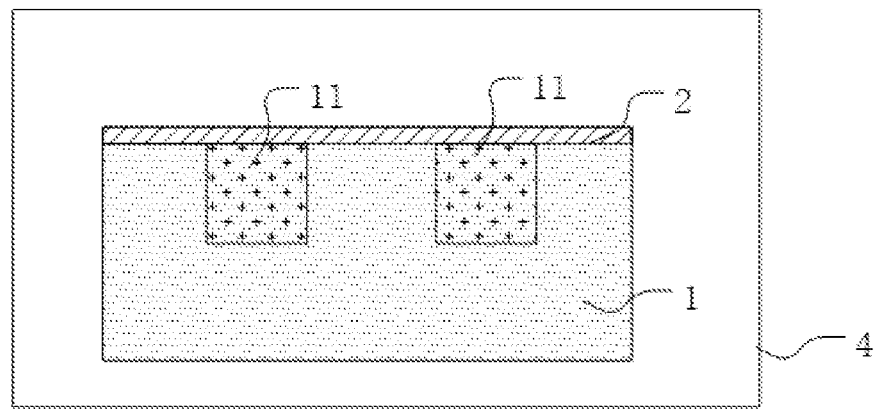
FIG. 10 is a schematic diagram of forming a first oxide layer on a surface of a target structure according to an exemplary embodiment.

Referring to FIG. 10, in the first pressure, a temperature at which the dopant ions in the doped region 11 are activated and escape from the target structure 1 is greater than the first temperature. As the target structure 1 is heated, when the temperature of the target structure 1 exceeds the first temperature, the dopant ions in the target structure 1 are activated in the heating process and diffused to the outside of the target structure 1. Because the dopant ions of the target structure 1 has a higher diffusion speed in the first material than in the oxide of the first material, the dopant ions quickly diffuse from the first material to the first oxide layer 2. However, once the dopant ions diffuse to the first oxide layer 2, the diffusion of the dopant ions slows down. The first oxide layer 2 prevents the dopant ions from escaping from the target structure 1. Compared with the target structure 1 without the first oxide layer 2, the structure in this embodiment effectively reduces the quantity of escaping dopant ions.

Step S230: Adjust the pressure in the reaction chamber to a second pressure; heat the target structure to a second temperature under the second pressure, maintain the second temperature for a preset duration, and form a second oxide layer under the first oxide layer 2.

In this embodiment, the target structure 1 is heated to the second temperature, and the second temperature is maintained for a second duration.

Figure 11:
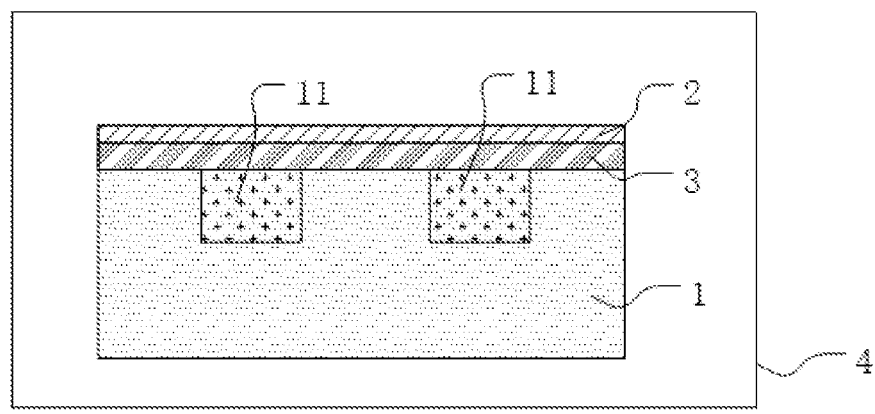
FIG. 11 is a schematic diagram of forming a second oxide layer under a first oxide layer according to an exemplary embodiment.

As shown in FIG. 11, in the second duration, for example, in 10 minutes, a part of the oxygen-containing gas in the reaction chamber 4 penetrates the first oxide layer 2 to diffuse into the target structure 1, and reacts with the first material at the bottom of the first oxide layer 2 to generate the oxide of the first material, where the bottom of the first oxide layer 2 is a side where the first oxide layer 2 and the target structure 1 are connected. The oxide of the first material gradually grows downwards from the bottom surface of the first oxide layer 2, to form the second oxide layer 3, where the second oxide layer 3 has a second thickness. In this embodiment, a sum of the first thickness and the second thickness is less than 3 nm.

Referring to FIG. 10 and FIG. 11, because the first oxide layer 2 is formed on an upper surface of the target structure 1, the first oxide layer 2 will prevent contact between the oxygen-containing gas and the target structure 1, which reduces the speed of reaction between the oxygen-containing gas and the first material to generate the second oxide layer 3. Moreover, as the second duration goes on, to diffuse into the target structure 1 to react with the first material, a part of the oxygen-containing gas in the reaction chamber 4 needs to penetrate a thicker oxide layer. Therefore, the reaction between the target structure 1 and the oxygen-containing gas to generate the second oxide layer 3 gradually slows down.

In this embodiment, by adjusting the reaction pressure in the reaction chamber 4, a total thickness of the formed first oxide layer 2 and the second oxide layer 3 (i.e., the sum of the first thickness and the second thickness) meets an expected thickness. Otherwise, the first oxide layer 2 will impede further oxidation of the target structure 1 because the first oxide layer 2 is formed early; as a result, the insulation effect for devices inside the semiconductor structure is reduced due to an excessively small second thickness, leading to an electrical degradation of the semiconductor structure. Meanwhile, by adjusting the reaction pressure in the reaction chamber, it also avoids an excessively thick oxide layer and reduces the consumption of the first material in the target structure, ensuring that sufficient first material is reserved in the target structure for the subsequent process.

According to an exemplary embodiment, a value of the first temperature is less than or equal to ½ of a value of the second temperature. For example, the second temperature is 700° C. to 900° C., and the first temperature is 300° C. to 450° C.; the second temperature is 950° C. to 1100° C., and the first temperature is 450° C. to 550° C.; the second temperature is 1300° C. to 1500° C., and the first temperature is 600° C. to 750° C.

In this embodiment, the second temperature is used as a target temperature of the thermal treatment process for the target structure. The pressure in the reaction chamber 4 is adjusted, such that the reaction chamber 4 is heated to the first temperature. That is, the first material reacts with the oxygen-containing gas in the reaction chamber, to form a thick enough first oxide layer 2 on the surface of the target structure 1. The first oxide layer 2 prevents the dopant ions from escaping from the target structure 1, such that more dopant ions are retained in the target structure 1 to provide carriers for the target structure 1; it also prevents an escape product of the dopant ions in a process environment from affecting the process environment.

According to an exemplary embodiment, this embodiment is a description of the implementation of step S230 of the foregoing embodiment. In the implementation process of step S230, the pressure in the reaction chamber 4 is adjusted. The pressure in the reaction chamber 4 is adjusted from the first pressure to the second pressure, where the first pressure (referring to FIG. S220) may be greater than the second pressure or less than the second pressure.

In some embodiments, the first pressure may be greater than second pressure. For example, the first pressure is set to 3 atm to 20 atm, where 1 atm is 1 standard atmospheric pressure. Under the first pressure, the target structure 1 is heated to the first temperature, and the first oxide layer 2 formed on the surface of the target structure 1 has thickness of 0.2 nm to 0.5 nm. When the second oxide layer 3 is formed, the pressure in the reaction chamber 4 is reduced to the second pressure, where the second pressure is 0.5 atm to 2 atm.

In another example, the first pressure is 3 atm to 20 atm, and the second pressure is also 3 atm to 20 atm, but the first pressure is greater than the second pressure. After the first oxide layer 2 is formed, the pressure in the reaction chamber 4 is slightly reduced, to reduce the speed of generating the second oxide layer 3, thereby reducing the consumption of the first material in the target structure 1 for forming the second oxide layer 3.

Compared with the embodiment in which the reaction chamber 4 maintains the first pressure all the time, in this embodiment, the first pressure in the reaction chamber 4 is adjusted to the second pressure in the second duration. As the pressure in the reaction chamber 4 decreases, the activity of the oxygen-containing gas in the reaction chamber 4 is reduced, and the speed of generating the second oxide layer 3 decreases, such that at the end of the second duration, the total thickness of the second oxide layer 3 and the first oxide layer 2 (the sum of the first thickness and the second thickness) is less than 3 nm, thus reducing the consumption of the first material in the target structure 1, and preventing too much first material from being oxidized by the oxygen-containing gas.

In some embodiments, the first pressure may be less than the second pressure. For example, the first pressure is 0.5 atm to 2 atm, and the second pressure is 3 atm to 20 atm. Under the first pressure, the target structure 1 is heated to the first temperature, and the first oxide layer 2 formed on the surface of the target structure 1 has a thickness of 0.1 nm to 0.2 nm.

In another example, the first pressure is 3 atm to 20 atm, and the second pressure is also 3 atm to 20 atm, but the first pressure is less than the second pressure. After the first oxide layer 2 is formed, the pressure in the reaction chamber 4 is slightly increased, to increase the speed of generating the second oxide layer 3.

Compared with the embodiment in which the reaction chamber 4 maintains the first pressure all the time, in this embodiment, before the second oxide layer 3 is formed, the pressure in the reaction chamber 4 is increased from the first pressure to the second pressure. In the second duration, since the pressure in the reaction chamber 4 is increased, the activity of the oxygen-containing gas in the reaction chamber 4 is increased. The oxygen-containing gas penetrates a thinner first oxide layer 2 in the diffusion process, and more oxygen-containing gas can penetrate the first oxide layer 2 to react with the first material. The second oxide layer 3 is generated at a higher speed, and the total thickness of the formed second oxide layer 3 and first oxide layer 2 (i.e., the sum of the first thickness and the second thickness) is 2 nm to 3 nm.

In other embodiments, after the first oxide layer 2 is formed, the pressure in the reaction chamber 4 may not be adjusted. That is, the first pressure is equal to the second pressure. The target structure 1 is heated to the first temperature under the constant pressure, to form the first oxide layer 2. Then, the target structure 1 is heated to the second temperature under the constant pressure, and heat preservation of a predetermined duration is performed under the second temperature, to form the second oxide layer 3.

For example, the first pressure is 3 atm to 20 atm, and the first pressure is equal to the second pressure. The first thickness is 0.2 nm to 0.5 nm, and the sum of the first thickness and the second thickness is 1.5 nm to 2.5 nm. In another example, the first pressure is 0.5 atm to 2 atm, and the first pressure is equal to the second pressure. The first thickness is 0.1 nm to 0.2 nm, and the second thickness is greater than 0.5 nm. In this embodiment, the process of adjusting the reaction pressure in the reaction chamber 4 is omitted, which simplifies the process steps and reduces the process difficulty.

According to an exemplary embodiment, this embodiment is a description of the implementation of the foregoing embodiment. In the implementation process, the forming method further includes a step of injecting a catalyst into the reaction chamber 4.

The type of the catalyst may be selected according to the first material. The catalyst may be gas or liquid. In this embodiment, the catalyst is added to the reaction chamber 4. The catalyst catalyzes the reaction between the first material and the oxygen-containing gas, which increases the oxidization speed and improves the quality of the formed first oxide layer 2 and the second oxide layer 3.

Figure 3:
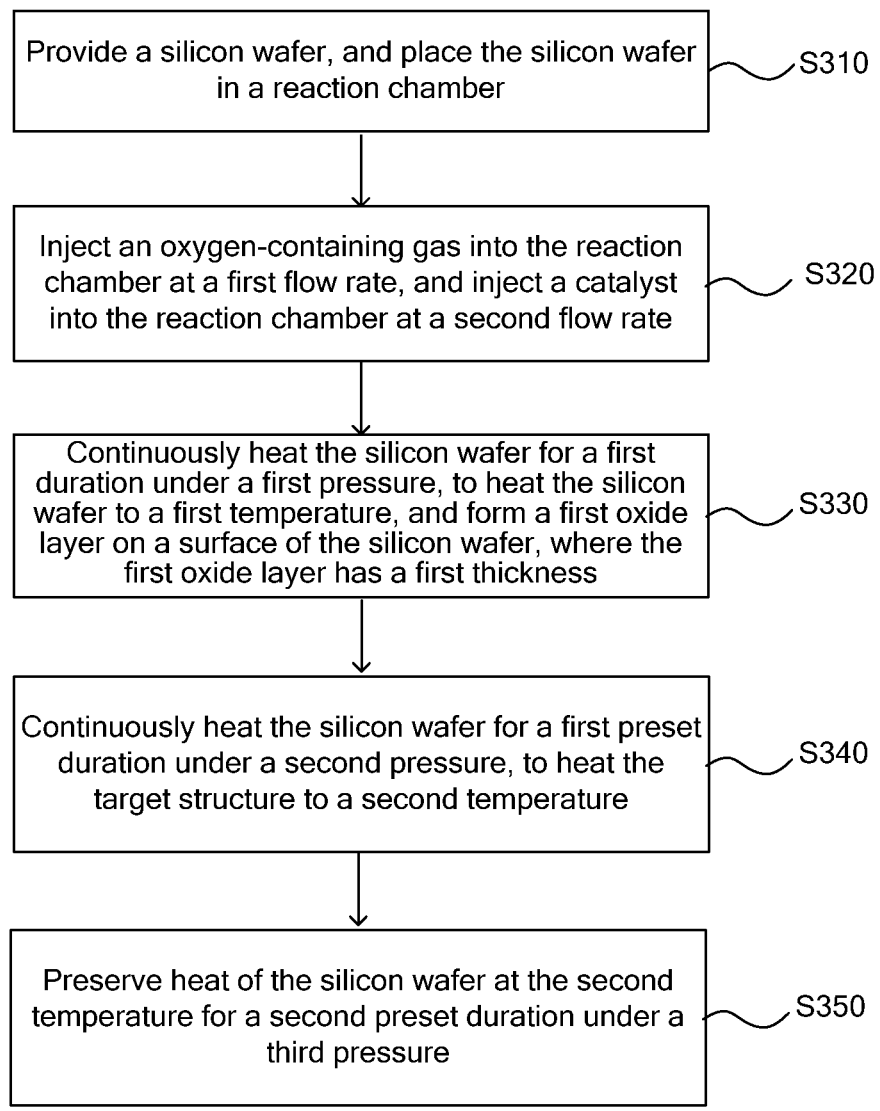
FIG. 3 is a flowchart of a forming method of a semiconductor structure according to an exemplary embodiment.

As shown in FIG. 3, an exemplary embodiment of the present disclosure provides a forming method of a semiconductor structure. The forming method includes the following steps:

Step S310: Provide a silicon wafer, and place the silicon wafer in a reaction chamber.

Referring to FIG. 9, in this embodiment, the target structure 1 is a silicon wafer. The silicon wafer includes at least one doped region 11. The doped region 11 is doped with dopant ions, and the dopant ions have a lower diffusion speed in the silicon dioxide than in the silicon wafer. The dopant ions may be at least one of phosphorus ions P+, arsenic ions As+, tellurium ions Te+ or boron ions B+.

Step S320: Inject an oxygen-containing gas into the reaction chamber at a first flow rate, and inject a catalyst into the reaction chamber at a second flow rate.

The first flow rate is 200 sccm to 500 sccm, and the second flow rate is 10 sccm to 50 sccm, where sccm represents standard milliliter/minute.

Nitrogen or argon is injected into the reaction chamber 4 as a protective gas; then, the oxygen-containing gas and the catalyst are injected into the reaction chamber 4 separately, to form an oxygen-containing atmosphere in the reaction chamber 4. In this embodiment, the oxygen-containing gas injected into the reaction chamber 4 is oxygen $O_2$. In other embodiments, the oxygen-containing gas may be ozone $O_3$ or the like. The catalyst may be in a gaseous form, and includes a halogen monomer or halogen compound. For example, the catalyst may be gaseous chlorine $Cl_2$, gaseous hydrogen chloride HCl, gaseous hydrofluoric acid HF, or the like. The catalyst may alternatively be in a liquid form, such as trichloroethylene $C_2HCl_3$ (TCE), chloroform $CHCl_3$ (TCA), or the like.

In the implementation process, if the ratio of the first flow rate to the second flow rate is excessively high, the content of the catalyst in the reaction chamber 4 is low, which may lead to inadequate catalysis and affect the catalytic effect. If the ratio of the first flow rate to the second flow rate is excessively low, the content of the catalyst in the reaction chamber 4 is excessive, and the excessive catalyst reacts with the silicon wafer to generate a silicon-chloride compound, which leads to excessive consumption of the silicon wafer and corrodes the surface of the silicon wafer. Therefore, the ratio of the first flow rate to the second flow rate is critical. In this embodiment, preferred ranges of the first flow rate and the second flow rate as well as preferred catalyst types are provided. The ratio of the first flow rate to the second flow rate is greater than 10:1. When the ratio of the first flow rate to the second flow rate is 10:1 to 20:1, the catalyst achieves an optimal catalytic effect for the reaction between silicon and oxygen to generate silicon dioxide.

The target structure 1 in this embodiment is a silicon wafer. For direct bonding of silicon and oxygen to generate silicon dioxide, a silicon-oxygen bond (Si—O) is required. The bond energy of the silicon-oxygen bond is 4.25 eV. The reaction between silicon and oxygen consumes a large amount of energy to generate silicon dioxide, and bonding between silicon and oxygen is difficult. Silicon and chlorine are bonded to form a silicon-chlorine bond (Si—Cl). The bond energy of the silicon-chlorine bond is 0.5 eV. The reaction between silicon and chlorine consumes a small amount of energy to generate a silicon-chlorine bond. Silicon and chlorine are easy to bond and have a high bonding speed. Based on the foregoing principle, in this embodiment, a gaseous chlorine source is fed into the reaction chamber 4. Silicon and chlorine form a silicon-chloride compound, the silicon-chloride compound reacts with oxygen to form silicon dioxide, which reduces the difficulty of forming silicon dioxide and improves the oxidization speed of silicon.

The catalyst being HCl is taken as an example to describe this embodiment. Gaseous HCl is injected into the reaction chamber 4. Under a high temperature, HCl reacts with $O_2$ to generate $H_2O$ and $Cl_2$; $Cl_2$ reacts with silicon Si on the surface of the silicon wafer to generate silicon tetrachloride $SiCl_4$; $SiCl_4$ reacts with oxygen to generate silicon dioxide $SiO_2$.

Step S330: Continuously heat the silicon wafer for a first duration under a first pressure, to heat the silicon wafer to a first temperature, and form a first oxide layer 2 on a surface of the silicon wafer, where the first oxide layer 2 has a first thickness.

The pressure in the reaction chamber 4 is adjusted to the first pressure. The first pressure is 5 atm to 15 atm. The silicon wafer is heated for the first duration, where the first duration is 3s to 5s, to heat the silicon wafer to the first temperature, where the first temperature is 450° C. to 550° C. Silicon on the surface of the silicon wafer reacts with the catalyst to generate a silicon-chloride compound, and the silicon-chloride compound reacts with oxygen to generate silicon dioxide. Referring to FIG. 10, after the foregoing process, the first oxide layer 2 is formed on the surface of the silicon wafer, where the thickness of the first oxide layer 2 is greater than 0.1 nm.

Step S340: Continuously heat the silicon wafer for a first preset duration under a second pressure, to heat the target structure to a second temperature.

The second pressure is 5 atm to 15 atm, and the second pressure is the same as or different from the first pressure. The silicon wafer is continuously heated under the second pressure for the first preset duration, where the first preset duration is 3s to 5s, to heat the silicon wafer to the second temperature. A value of the first temperature is less than or equal to ½ of a value of the second temperature, where the second temperature is 950° C. to 1100° C. In the first preset duration, a part of the catalyst and a part of oxygen diffuse to an area under the first oxide layer 2 through the first oxide layer 2, to oxidize silicon under the first oxide layer 2 to generate silicon dioxide.

Step S350: Preserve heat of the silicon wafer at the second temperature for a second preset duration under a third pressure.

The third pressure is 5 atm to 15 atm, and the third pressure is the same as or different from the second pressure. Heat of the silicon wafer is preserved for the second preset duration under the third pressure, where the second preset duration is 5s to 60s. In the second preset duration, the first oxide layer 2 gradually grows downwards to form silicon dioxide. A total duration of the first preset duration and the second preset duration is a second duration. At the end of the second duration, injection of oxygen into the reaction chamber 4 is stopped, and the second oxide layer 3 is formed under the first oxide layer 2. The second oxide layer 3 has a second thickness, and a sum of the first thickness and the second thickness is less than 3 nm. In this embodiment, after heat of the silicon wafer is preserved for the second preset duration under the second temperature, the silicon wafer is cooled at a predetermined cooling rate, to cool the silicon wafer to room temperature.

In the forming method of a semiconductor structure of this embodiment, the catalyst is injected into the reaction chamber. The catalyst is a chlorine catalyst. The formed first oxide layer and second oxide layer are doped with chloride ions. The chloride ions can fill oxygen vacancies generated during the formation of the first oxide layer and the second oxide layer, reduce the defects of the first oxide layer and the second oxide layer, and improve breakdown voltages of the first oxide layer and the second oxide layer. Meanwhile, the chloride ions can also bind to heavy metal ions in the process environment to prevent the heavy metal ions from contaminating the silicon wafer. Moreover, in this embodiment, at the $SiO_2$—Si interface between the formed second oxide layer and the silicon wafer, a part of the silicon-chloride compound does not bind to oxygen, that is, some chloride ions are distributed at the $SiO_2$—Si interface. The chloride ions form negative charge centers at the $SiO_2$—Si interface, which can neutralize the positive charges accumulated at the $SiO_2$—Si, reducing the fixed positive charge density and the interfacial density of states and improving the lifetime of carriers in the silicon wafer.

The following provides specific examples of this exemplary embodiment.

Table 1 shows specific parameters in a forming process in the forming method of a semiconductor structure according to this exemplary embodiment. It should be noted that, the specific parameters in the forming method of a semiconductor structure of the present disclosure are not limited to the data in Table 1.

According to Table 1, in this embodiment, thermal treatment is performed on the doped silicon wafer. The pressure of the thermal treatment is adjusted, and the oxygen atmosphere of the thermal treatment process is adjusted by means of the catalyst, such that the silicon wafer can be oxidized in the oxygen atmosphere before it is heated to one-half of the target temperature. The first oxide layer 2 is formed on the surface of the silicon wafer. The first oxide layer 2 blocks the diffusion of dopant ions to the outside to avoid the contamination of the process environment by dopant ions that escape during the thermal treatment process.

According to an exemplary embodiment, this embodiment is a description of the implementation of step S320 of the foregoing embodiment. In the implementation process, thermal treatment is performed on the silicon wafer, and the second flow rate is controlled. The second flow rate is dynamically adjusted according to the duration of the thermal treatment for the silicon wafer. In this embodiment, heating the silicon wafer to the first temperature, heating the silicon wafer to the second temperature, and preserving heat of the silicon wafer at the second temperature all belong to the thermal treatment processes of the silicon wafer.

In some examples, the second flow rate may be controlled to be positively correlated with the duration of the thermal treatment. That is, on the condition that the first flow rate is 200 sccm to 500 sccm, the second flow rate is 10 sccm to 50 sccm, and the ratio of the first flow rate to the second flow rate is greater than 10:1, the second flow rate increases gradually from the beginning of the first duration to the end of the second duration. Referring to FIG. 11, for the first

TABLE 1

Specific examples of the forming method of a semiconductor structure

| | Example X1 | Example X2 | Example X3 | Example X4 | Example X5 | Example X6 | Example X7 | Example X8 |
|---|---|---|---|---|---|---|---|---|
| Dopant ions | P+ | As+ | Te+ | B+ | P+, As+ | As+ | Te+ | B+ |
| Oxygen-containing gas (component) | $O_2$ | $O_2$ | $O_2$ | $O_2$ | $O_2$ | $O_2$ | $O_2$ | $O_2$ |
| First flow rate (sccm) | 200 | 300 | 400 | 500 | 250 | 350 | 450 | 480 |
| Catalyst (component) | HCl | HCl | HCl | HCl | $Cl_2$ | $Cl_2$ | HF | HF |
| Second flow rate (sccm) | 10 | 20 | 32 | 50 | 15 | 25 | 35 | 40 |
| Ratio of first flow rate to second flow rate | 20 | 15 | 12.5 | 10 | 16.66 | 14 | 12.86 | 12 |
| First pressure (atm) | 15 | 12 | 9 | 5 | 14 | 11 | 8 | 6 |
| First duration (s) | 3 | 3.5 | 4 | 5 | 3.5 | 4 | 4.2 | 4.5 |
| First thickness (nm) | 0.1 | 0.18 | 0.24 | 0.3 | 0.12 | 0.2 | 0.22 | 0.26 |
| First temperature (° C.) | 450 | 480 | 500 | 550 | 460 | 490 | 510 | 540 |
| Second pressure (atm) | 10 | 12 | 9 | 10 | 11 | 9 | 12 | 10.5 |
| Second temperature (° C.) | 900 | 980 | 1000 | 1100 | 950 | 1020 | 1050 | 1080 |
| First preset duration (s) | 3 | 3.5 | 4 | 5 | 3.5 | 4 | 4.2 | 4.5 |
| Third pressure (atm) | 5 | 8 | 9 | 15 | 9 | 9 | 14 | 14.5 |
| Second preset duration (s) | 60 | 40 | 30 | 10 | 50 | 45 | 35 | 25 |
| Sum of first thickness and second thickness (nm) | 2.8 | 2.2 | 3 | 2.4 | 2.7 | 2.6 | 2.1 | 2.3 | oxide layer 2 and the second oxide layer 3 formed according to this example, densities of the first oxide layer 2 and the second oxide layer 3 gradually increase from a top surface of the first oxide layer 2 to a bottom surface of the second oxide layer 3.

For example, at the beginning of the first duration, the catalyst is injected into the reaction chamber 4 at a rate of 10 sccm, then the rate gradually increases at a rate of 0.5 sccm/s to 1 sccm/s, and the injection stops at the end of the second duration. In this example, the second flow rate increases as the thermal treatment goes on, so as to increase the oxidization rate of silicon, and ensure that the total thickness of the first oxide layer 2 and the second oxide layer 3 meets the expectation. The first oxide layer 2 and the second oxide layer 3 can provide a good shielding effect for the silicon wafer.

In some other embodiments, it is also possible to control the second flow rate to be negatively correlated with the duration of the thermal treatment. That is, on the condition that the first flow rate is 200 sccm to 500 sccm, the second flow rate is 10 sccm to 50 sccm, and the ratio of the first flow rate to the second flow rate is greater than 10:1, the second flow rate decreases gradually from the beginning of the first duration to the end of the second duration. Referring to FIG. 11, for the first oxide layer 2 and the second oxide layer 3 formed according to this example, densities of the first oxide layer 2 and the second oxide layer 3 gradually decrease from a top surface of the first oxide layer 2 to a bottom surface of the second oxide layer 3.

For example, at the beginning of the first duration, the catalyst is injected into the reaction chamber 4 at a rate of 50 sccm, then the rate gradually decreases at a rate of 0.5 sccm/s to 1 sccm/s, and the injection stops at the end of the second duration. In this embodiment, when the first oxide layer 2 is formed, the catalyst in the reaction chamber 4 has a high concentration, silicon is oxidized quickly, and the formed first oxide layer 2 has a higher density and thickness. The first oxide layer 2 can better prevent the dopant ions from escaping from the silicon wafer.

According to an exemplary embodiment, this embodiment is a description of the implementation of step S320 of the foregoing embodiment. In the implementation process, a gaseous mixture of the oxygen-containing gas and the catalyst is further injected into the reaction chamber 4; alternatively, the oxygen-containing gas and the catalyst are injected into the reaction chamber 4 alternately by pulses.

In this embodiment, the method of injecting the oxygen-containing gas and the catalyst into the reaction chamber 4 is more flexible. In the practical forming process, the method of injecting the oxygen-containing gas and the catalyst can be adjusted according to the manufacturing process and manufacturing device.

Figure 4:
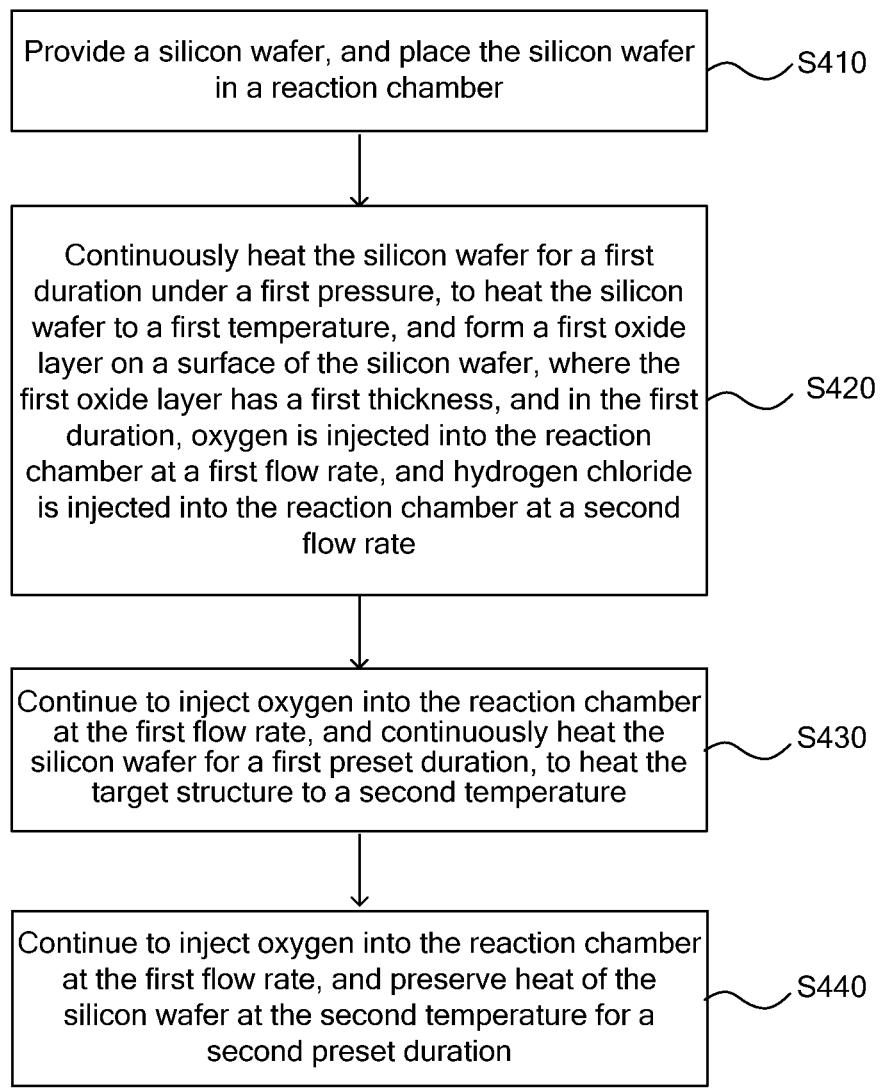
FIG. 4 is a flowchart of a forming method of a semiconductor structure according to an exemplary embodiment.

As shown in FIG. 4, an exemplary embodiment of the present disclosure provides a forming method of a semiconductor structure. The forming method includes the following steps:

Step S410: Provide a silicon wafer, and place the silicon wafer in a reaction chamber. Referring to FIG. 9, in this embodiment, the target structure 1 is a silicon wafer. The forming method of this embodiment is applied to the silicon wafer after ion implantation. The silicon wafer includes at least one doped region 11 formed through ion implantation. The doped region 11 includes at least one type of dopant ions, and the dopant ions may be one of phosphorus ions $P^{5+}$, arsenic ions $As^{5+}$, and tellurium ions $Te^{5+}$.

In this embodiment, the reaction chamber 4 is a thermal annealing apparatus, and nitrogen is injected into the reaction chamber 4 as a protective gas.

Step S420: Continuously heat the silicon wafer for a first duration under a first pressure, to heat the silicon wafer to a first temperature, and form a first oxide layer on a surface of the silicon wafer, where the first oxide layer has a first thickness, and in the first duration, oxygen is injected into the reaction chamber at a first flow rate, and hydrogen chloride is injected into the reaction chamber at a second flow rate.

The pressure in the reaction chamber 4 is adjusted to the first pressure, where the first pressure is 5 atm to 15 atm. For example, the first pressure may be 5 atm, 6 atm, 6.5 atm, 7.5 atm, 8.5 atm, 9.5 atm, 10.5 atm, 11.5 atm, 12.5 atm, 13.5 atm, 14.5 atm or 15 atm. Under the first pressure, the silicon wafer is heated at a predetermined heating rate for the first duration, where the heating rate may be 80° C./s to 150° C./s, and the first duration is 3s to 5s. The silicon wafer is heated to the first temperature, where the first temperature is 450° C. to 550° C.

In the first duration, oxygen is injected into the reaction chamber 4 at the first flow rate, where the first flow rate is 200 sccm to 500 sccm. For example, the first flow rate may be 200 sccm, 230 sccm, 260 sccm, 275 sccm, 310 sccm, 335 sccm, 365 sccm, 395 sccm, 410 sccm, 435 sccm, 455 sccm, 480 sccm or 500 sccm.

Hydrogen chloride is injected into the reaction chamber 4 at the second flow rate, where the second flow rate is 10 sccm to 50 sccm. For example, the second flow rate may be 10 sccm, 11 sccm, 15 sccm, 17 sccm, 21 sccm, 25 sccm, 26 sccm, 31 sccm, 35 sccm, 37 sccm, 41 sccm, 45 sccm, 47 sccm or 50 sccm. A ratio of the second flow rate to the second flow rate is 10 to 20:1.

Referring to FIG. 10, in the first duration, the hydrogen chloride is used as the catalyst to catalyze the reaction between silicon on the surface of the silicon wafer and oxygen, to form the first oxide layer 2 on the surface of the silicon wafer, where the first oxide layer 2 has a first thickness of 0.2 nm to 0.5 nm.

Step S430: Continue to inject oxygen into the reaction chamber 4 at the first flow rate, and continuously heat the silicon wafer for a first preset duration, to heat the target structure 1 to a second temperature.

The silicon wafer is continuously heated at a predetermined heating rate for the first preset duration, where the first preset duration is 3s to 5s, and the silicon wafer is heated to the second temperature, where the second temperature is 900° C. to 1100° C. Step S440: Continue to inject oxygen into the reaction chamber at the first flow rate, and preserve heat of the silicon wafer at the second temperature for a second preset duration.

In this embodiment, the second preset duration is 5s to 60s, e.g., 30s to 60s. For example, heat of the silicon wafer is preserved at the second temperature for 30s, 35s, 40s, 45s, 50s, 55s or 60s. In this way dopant ions in the silicon wafer are activated. The dopant ions in the silicon wafer can provide carriers for the silicon wafer to change the electrical property of the silicon wafer.

A total duration of the first preset duration and the second preset duration is the second duration. At the end of the first duration, injection of the catalyst into the reaction chamber 4 is stopped. However, oxygen is continuously injected into the reaction chamber 4 in the second duration. Therefore, referring to FIG. 11, in the second duration, a part of oxygen diffuses to an area under the first oxide layer 2 to react with partial silicon under the first oxide layer 2 to generate silicon dioxide. Silicon dioxide grows downwards from the bottom surface of the first oxide layer 2 to form the second oxide layer 3. The second oxide layer 3 has a second thickness, and a sum of the first thickness and the second thickness is 0.5 nm to 2 nm.

In this embodiment, oxygen and the catalyst are injected into the reaction chamber in the first duration, and only oxygen is injected into the reaction chamber in the second duration. In this embodiment, the first oxide layer 2 is formed earlier, and has a high thickness and density. When the silicon wafer is heated to the first temperature, the first oxide layer 2 is thick enough to provide a good shielding effect for the silicon wafer, to prevent dopant ions in the silicon wafer from escaping and avoid the escaping content from contaminating the process environment. More dopant ions are reserved in the silicon wafer to provide carriers for the silicon wafer, such that the silicon wafer has better electrical performance.

Figure 5:
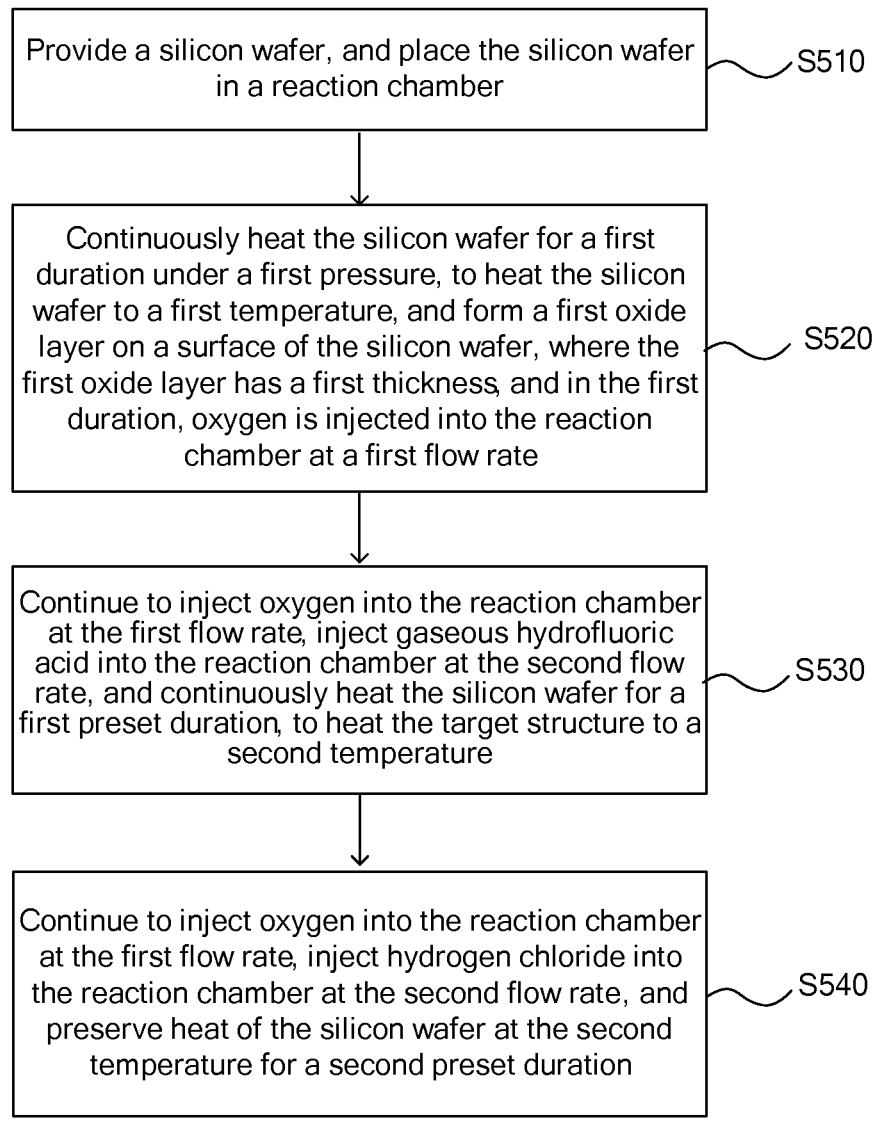
FIG. 5 is a flowchart of a forming method of a semiconductor structure according to an exemplary embodiment.

As shown in FIG. 5, an exemplary embodiment of the present disclosure provides a forming method of a semiconductor structure. The forming method includes the following steps:

Step S510: Provide a silicon wafer, and place the silicon wafer in a reaction chamber.

Referring to FIG. 9, in this embodiment, the target structure 1 is a silicon wafer. The forming method of this embodiment is applied to the silicon wafer after ion implantation. The silicon wafer includes at least one doped region 11 formed through ion implantation. The doped region 11 includes at least one type of dopant ions, and the dopant ions may be one boron ions $B^{3+}$.

In this embodiment, the reaction chamber 4 is a vacuum annealing furnace, and argon is injected into the reaction chamber 4 as a protective gas.

Step S520: Continuously heat the silicon wafer for a first duration under a first pressure, to heat the silicon wafer to a first temperature, and form a first oxide layer on a surface of the silicon wafer, where the first oxide layer has a first thickness, and in the first duration, oxygen is injected into the reaction chamber at a first flow rate.

The pressure in the reaction chamber 4 is adjusted to the first pressure, where the first pressure is 3 atm to 15 atm. For example, the first pressure may be 5 atm, 5.4 atm, 6.3 atm, 7.2 atm, 8.1 atm, 9.6 atm, 10.8 atm, 11.1 atm, 12.9 atm, 13.7 atm, 14.3 atm or atm. Under the first pressure, the silicon wafer is heated at a predetermined heating rate for the first duration, where the heating rate may be 80° C./s to 150° C./s, and the first duration is 3s to 5s. The silicon wafer is heated to the first temperature, where the first temperature is 450° C. to 550° C.

In the first duration, oxygen is injected into the reaction chamber 4 at the first flow rate, where the first flow rate is 200 sccm to 500 sccm. For example, the first flow rate may be 200 sccm, 210 sccm, 270 sccm, 295 sccm, 350 sccm, 345 sccm, 375 sccm, 425 sccm, 440 sccm, 445 sccm, 435 sccm, 475 sccm or 500 sccm.

Hydrogen chloride is injected into the reaction chamber 4 at a second flow rate, where the second flow rate is 10 sccm to 50 sccm. For example, the second flow rate may be 10 sccm, 11 sccm, 12 sccm, 13 sccm, 21 sccm, 22 sccm, 23 sccm, 31 sccm, 32 sccm, 33 sccm, 41 sccm, 42 sccm, 43 sccm or 50 sccm. A ratio of the second flow rate to the second flow rate is 10 to 20:1.

Referring to FIG. 10, in the first duration, silicon on the surface of the silicon wafer reacts with oxygen, to form the first oxide layer 2 on the surface of the silicon wafer, where the first oxide layer 2 has a first thickness of 0.1 nm to 0.2 nm.

Step S530: Continue to inject oxygen into the reaction chamber 4 at the first flow rate, inject gaseous hydrofluoric acid into the reaction chamber at the second flow rate, and continuously heat the silicon wafer for a first preset duration, to heat the target structure to a second temperature.

The processing manner of this embodiment is the same as that of the foregoing is embodiment. The difference lies in that, gaseous hydrofluoric acid (HF) is injected into the reaction chamber 4 at the second flow rate in the first preset duration, where the second flow rate is 10 sccm to 50 sccm. For example, the second flow rate may be 10 sccm, 13 sccm, 16 sccm, 18 sccm, 23 sccm, 26 sccm, 28 sccm, 33 sccm, 36 sccm, 38 sccm, 43 sccm, 46 sccm, 48 sccm or 50 sccm. A ratio of the first flow rate to the second flow rate is 10 to 20:1.

Step S540: Continue to inject oxygen into the reaction chamber at the first flow rate, inject hydrogen chloride into the reaction chamber at the second flow rate, and preserve heat of the silicon wafer at the second temperature for a second preset duration.

The processing manner of this embodiment is the same as that of the foregoing embodiment. The difference lies in that, gaseous hydrofluoric acid is injected into the reaction chamber 4 at the second flow rate in the second preset duration.

Referring to FIG. 11, a total duration of the first preset duration and the second preset duration is a second duration. In the second duration, a part of hydrofluoric acid and a part of oxygen diffuse to an area under the first oxide layer 2 to react with silicon, to form the second oxide layer 3 under the first oxide layer 2. A density of the second oxide layer 3 is greater than that of the first oxide layer 2; the second oxide layer 3 has a second thickness, and a sum of the first thickness and the second thickness is 2 nm to 3 nm.

In this embodiment, only oxygen is injected into the reaction chamber in the first duration, and gaseous hydrofluoric acid is not injected into the reaction chamber until the beginning of the second duration. In the second duration, the addition of gaseous hydrofluoric acid accelerates silicon oxidization under the first oxide layer 2, such that the formed first oxide layer 2 and second oxide layer 3 have a larger total thickness, and the oxide layers can provide a good shielding effect for the silicon wafer.

An exemplary embodiment of the present disclosure provides a semiconductor structure. As shown in FIG. 11, the semiconductor structure includes: a doped region 11, a first oxide layer 2, and a second oxide layer 3. The first oxide layer 2 covers a surface of the semiconductor structure. The first oxide layer 2 has a first thickness, the second oxide layer 3 is located under the first oxide layer 2, the second oxide layer 3 has a second thickness, and the first thickness is less than the second thickness.

The doped region 11 includes dopant ions. The dopant ions may be at least one of phosphorus ions P+, arsenic ions As+, tellurium ions Te+ or boron ions B+.

In some embodiments, the first thickness is greater than 0.1 nm, and a sum of the first thickness and the second thickness is less than 3 nm. For example, the first thickness is 0.1 nm to 0.5 nm, and the sum of the first thickness and the second thickness is 0.5 nm to 3 nm.

In some embodiments, a density of the first oxide layer 2 is greater than that of the second oxide layer 3; alternatively, the density of the first oxide layer 2 is less than that of the second oxide layer 3.

In some embodiments, the densities of the first oxide layer 2 and the second oxide layer 3 increase gradually from a top surface of the first oxide layer 2 to a bottom surface of the second oxide layer 3; alternatively, the densities of the first oxide layer 2 and the second oxide layer 3 decrease gradually from the top surface of the first oxide layer 2 to the bottom surface of the second oxide layer 3.

In the semiconductor structure of this embodiment, the second oxide layer 3 and the first oxide layer 2 are sequentially provided on the surface of the target structure. The second oxide layer 3 and the first oxide layer 2 provide a good shielding effect for the semiconductor structure, to prevent dopant ions from escaping from the semiconductor structure to contaminate the process environment, avoid a decrease in the concentration of the dopant ions in the semiconductor structure, and ensure good electrical performance of the semiconductor structure.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the forming method of a semiconductor structure and the semiconductor structure provided by the embodiments of the present disclosure, the second oxide layer and the first oxide layer are sequentially provided on the surface of the target structure. The second oxide layer and the first oxide layer provide a good shielding effect for the target structure, to ensure good electric performance of the semiconductor structure.

The invention claimed is:

1. A forming method of a semiconductor structure, comprising:
    placing a target structure in a reaction chamber; and
    forming a first oxide layer on the target structure, wherein the first oxide layer has a first thickness; and forming a second oxide layer under the first oxide layer, wherein the second oxide layer has a second thickness, and the first thickness is less than the second thickness;
    wherein the first thickness is greater than 0.1 nm, and a sum of the first thickness and the second thickness is less than 3 nm.

2. The forming method of a semiconductor structure according to claim 1, wherein the forming a first oxide layer on the target structure comprises:
    adjusting a pressure in the reaction chamber to a first pressure; and
    continuously heating the target structure for a first duration under the first pressure, to heat the target structure to a first temperature, and forming the first oxide layer on a surface of the target structure.

3. The forming method of a semiconductor structure according to claim 2, wherein the forming a second oxide layer under the first oxide layer comprises:
    adjusting the pressure in the reaction chamber to a second pressure; and
    heating the target structure to a second temperature under the second pressure, maintaining the second temperature for a preset duration, and forming the second oxide layer under the first oxide layer, wherein the target structure is heated to the second temperature and the second temperature is maintained for a second duration.

4. The forming method of a semiconductor structure according to claim 3, wherein the first pressure is greater than the second pressure, the first pressure is 3 atm to 20 atm, and the second pressure is 0.5 atm to 2 atm.

5. The forming method of a semiconductor structure according to claim 3, wherein the first pressure and the second pressure are both 3 atm to 20 atm.

6. The forming method of a semiconductor structure according to claim 3, wherein the first pressure is less than the second pressure, the first pressure is 0.5 atm to 2 atm, and the second pressure is 3 atm to 20 atm.

7. The forming method of a semiconductor structure according to claim 3, wherein a value of the first temperature is less than or equal to ½ of a value of the second temperature, the first temperature is 450° C. to 550° C., and the second temperature is 950° C. to 1100° C.

8. The forming method of a semiconductor structure according to claim 3, the forming method further comprises:
injecting an oxygen-containing gas into the reaction chamber at a first flow rate; and
injecting a catalyst into the reaction chamber at a second flow rate, wherein the catalyst is a gas, and the catalyst comprises a halogen monomer or a halogen compound.

9. The forming method of a semiconductor structure according to claim 8, the forming method further comprises:
performing thermal treatment on the target structure, and controlling the second flow rate to be positively correlated with a duration of the thermal treatment, wherein densities of the first oxide layer and the second oxide layer gradually increase from a top surface of the first oxide layer to a bottom surface of the second oxide layer;
or,
performing thermal treatment on the target structure, and controlling the second flow rate to be negatively correlated with a duration of the thermal treatment, wherein densities of the first oxide layer and the second oxide layer gradually decrease from a top surface of the first oxide layer to a bottom surface of the second oxide layer.

10. The forming method of a semiconductor structure according to claim 8, the forming method further comprises:
injecting the oxygen-containing gas and the catalyst into the reaction chamber in the first duration; and stopping injecting the catalyst into the reaction chamber at an end of the first duration, such that a density of the first oxide layer is greater than that of the second oxide layer.

11. The forming method of a semiconductor structure according to claim 8, the forming method further comprises:
injecting the oxygen-containing gas into the reaction chamber in the first duration and the second duration; and injecting the catalyst into the reaction chamber at a beginning of the second duration, such that a density of the second oxide layer is greater than that of the first oxide layer.

12. The forming method of a semiconductor structure according to claim 8, wherein a ratio of the first flow rate to the second flow rate is greater than 10:1.

13. The forming method of a semiconductor structure according to claim 8, wherein the first flow rate is 200 sccm to 500 sccm; and the second flow rate is 10 sccm to 50 sccm.

14. The forming method of a semiconductor structure according to claim 8, wherein a gaseous mixture of the oxygen-containing gas and the catalyst is injected into the reaction chamber;
or,
the oxygen-containing gas and the catalyst are injected into the reaction chamber alternately by pulses.

15. The forming method of a semiconductor structure according to claim 2, wherein the target structure comprises a doped region, dopant ions are implanted in the doped region, and a temperature at which the dopant ions are activated and escape from the target structure is greater than the first temperature.

16. A semiconductor structure, comprising:
a doped region, wherein the doped region comprises dopant ions;
a first oxide layer, wherein the first oxide layer covers a surface of the semiconductor structure, and the first oxide layer has a first thickness; and
a second oxide layer, wherein the second oxide layer is located under the first oxide layer, the second oxide layer has a second thickness, and the first thickness is less than the second thickness;
wherein the first thickness is greater than 0.1 nm, and a sum of the first thickness and the second thickness is less than 3 nm.

17. The semiconductor structure according to claim 16, wherein a density of the first oxide layer is greater than that of the second oxide layer;
or,
a density of the first oxide layer is less than that of the second oxide layer.

18. The semiconductor structure according to claim 16, wherein densities of the first oxide layer and the second oxide layer increase gradually from a top surface of the first oxide layer to a bottom surface of the second oxide layer;
or,
densities of the first oxide layer and the second oxide layer decrease gradually from a top surface of the first oxide layer to a bottom surface of the second oxide layer.

* * * * *